CONTROL CIRCUITS FOR ELECTRONIC SWITCHES

Filed Dec. 22, 1960 2 Sheets-Sheet 1

INVENTORS
PAUL G. LUCAS
SHERMAN RIGBY
BY Kenway, Jenney & Hildreth
ATTORNEYS

June 2, 1964 P. G. LUCAS ETAL 3,135,874

CONTROL CIRCUITS FOR ELECTRONIC SWITCHES

Filed Dec. 22, 1960 2 Sheets-Sheet 2

INVENTORS
PAUL G. LUCAS
SHERMAN RIGBY

BY Kinney, Jenney & Hildreth

ATTORNEYS 3,135,874

CONTROL CIRCUITS FOR ELECTRONIC SWITCHES

Paul G. Lucas, Brookline, and Sherman Rigby, Boston, Mass., assignors to Adage, Inc., Cambridge, Mass., a corporation of Massachusetts Filed Dec. 22, 1960, Ser. No. 77,739
11 Claims. (Cl. 307—88.5)

Our invention relates to electronic switches for controlling current flow, and more particularly it is concerned with control circuits for electronic switches.

Electronic circuits capable of performing switching functions are well known, especially in the field of digital computers. In operation, one conventional type of electronic switching circuit permits current to flow from an input circuit to an output circuit only when the voltage across the input circuit exceeds a predetermined threshold value. Another type of circuit operates to divert current away from the output circuit in response to control signals. Neither of these switch types is suitable for high speed multiplexing of analog signals i.e. for selecting one of a plurality of input analog signal circuits for connection to an output circuit in a repetitive sequence at high speed.

For rapid multiplexing of analog signals, and for a number of other circuit applications, it is desirable that a switch be connected in series between input and output terminals rather than in parallel with the input or output circuit. Most of the desirable electronics switches e.g. transistors and diode switches, have one or more control terminals and input or output terminals which are not completely isolated from the control terminals. Thus the current which is supplied to control the switch affects either the input or output circuit associated with it. When the switch is series connected between a source and a load, the current source for driving the switch must therefore be isolated from the reference potential for the source and load circuits. Otherwise the driving current would affect the switched signal.

In the past this problem has been met by supplying control signals to the switch through a transformer, the secondary of which was connected to the switch driving terminals, but which was otherwise "floating." This arrangement was satisfactory for those applications where size and cost were not important considerations. However pulse transformers are both bulky and expensive as compared with other circuit components since they must provide good isolation between primary and secondary in this application. Further, the excess stray capacity introduced by a transformer has a very undesirable effect on high impedance circuits which are often the source for signals to be measured.

Accordingly, it is a principal object of our invention to provide an improved control circuit for series switches of the type described.

A more specific object of our invention is to provide an improved control circuit for series transistor switching circuits.

A further object of our invention is to provide an improved control circuit for diode switches connected in series between signal source and load.

A more specific object of our invention is to provide a smaller, less costly control circuit for series electronic switches wherein the need for a transformer is eliminated.

Other and further objects of our invention will in part be obvious and will in part appear hereinafter.

In accordance with the present invention, the foregoing and other objects are achieved by providing a switching control circuit which includes a voltage source, an energy storage element, for example a capacitor, and steering diodes which control the charge-discharge path of the capacitor and provide for isolation of the voltage source from the input signal. A control signal of one polarity will cause the storage element to charge and apply a reverse bias across the control terminals of the switch, thus maintaining the switch in the open state; a control signal of the opposite polarity will allow the storage element to discharge through the switch, thus turning the switch to the "on" or closed state and maintaining it in this state until a control signal of the first polarity is again received at the control signal terminals.

For a fuller understanding of our invention, reference should be had to the following detailed description taken in connection with the drawings in which.

In general, we have found that switches of the type described, may be controlled in the following manner. A flip-flop or other bistable device is provided having a pair of output terminals which reverse polarity depending on its state. During the period when the switch is to be *open,* a reverse bias is applied to the switch control terminals from the flip-flop. This same biasing voltage is used to charge a storage element, such as a capacitor. When the flip-flop state is changed one or more, diodes disconnect it from the control circuit. A second current path (which may include, for example, a resistor or one or more diodes) diode or diodes connects the charged capacitor to the switch control terminals in the appropriate manner so that the discharging capacitor supplies the necessary current to maintain the switch in a "closed" condition. Operation of the flip-flop to its original state again reverse biases the switch and recharges the capacitor. We have found, as will be more fully explained below, that our circuit is useful for both transistor and diode switches. We have devised a simple circuit which isolates the input or output terminal from the control signal only when the switch is closed. A more elaborate circuit provides for isolation of both input and output terminals under all conditions.

Figure 1:
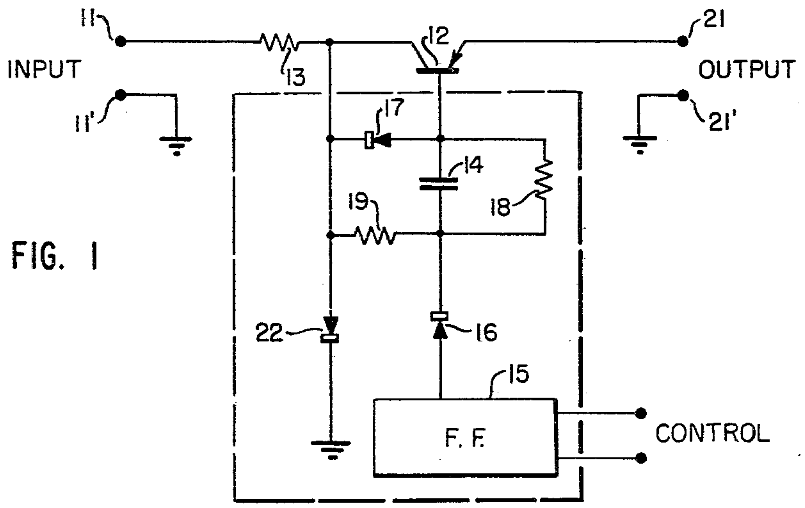
FIG. 1 is a schematic diagram of a transistor series switch controlled by a circuit of our invention.
Figure 3:
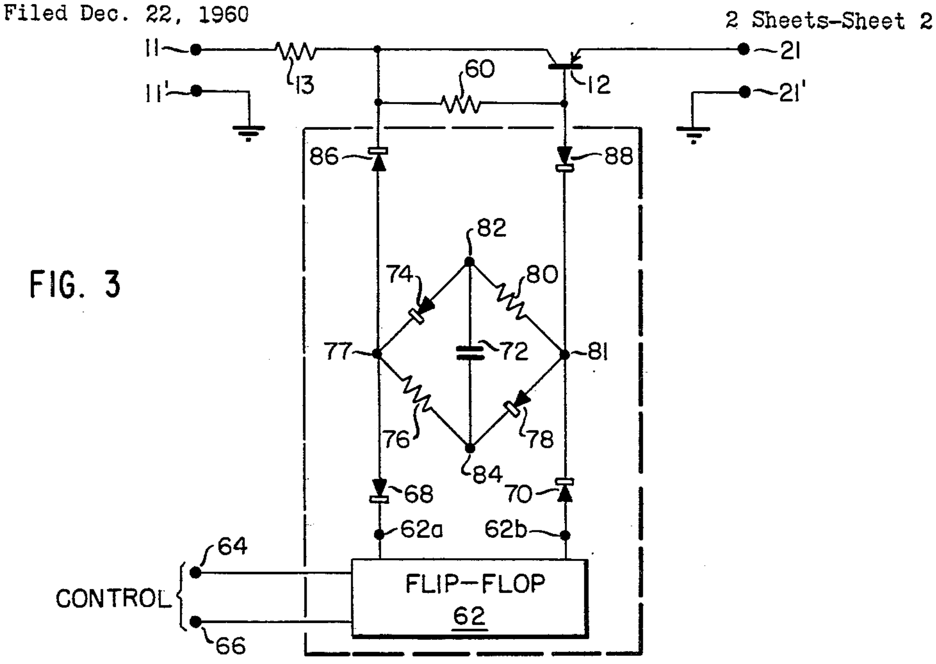
FIG. 3 is a schematic diagram similar to FIG. 1 of a more elaborate control circuit.

It is to be noted that the circuits of FIGURES 1 and 3 utilize a transistor switch in which the transistor is connected in the so-called "inverted" configuration. This configuration is used to provide a very low voltage drop from collector to emitter when the transistor is operated in the saturated mode. Thus a very low impedance path is provided through the transistor when the switch is "on" or "closed."

With reference first to FIG. 1, it will be observed that the numeral 12 designates generally a PNP type transistor which is the only type to be considered herein. It will be understood, however, that an NPN transistor can also be used as only changes in polarity are required to effect the substitution. As shown, the transistor 12 is arranged as a series switch with collector input and emitter follower output and with the control pulse applied to the base. That is to say, the collector is the electrode of the transistor 12 connected to one of the input terminals 11 of the circuit through a resistor 13 whose function will be explained below. The emitter or output circuit electrode of the transistor 12 is connected directly to one of the output terminals 21. The control input circuit electrode, namely the base of the transistor is connected to one electrode of a capacitor 14 which has its other electrode coupled to one output terminal of a flip-flop 15, through diode 16. Also, the base is connected to the anode of a diode 17 which has its cathode connected to the collector. A resistor 18 disposed in parallel relation to capacitor 14, a substantially smaller resistor 19 connected between the cathode of diode 16 and the collector of the transistor, and still another diode 22 connecting the collector to a ground common to the other input and output terminals 11' and 21' complete the circuit.

In operation, a positive voltage on the output terminal of the flip-flop serves to turn the transistor off; that is a positive voltage effectively opens the circuit between the input and output terminals by reverse biasing the transistor by means of the voltage drop across diode 17. A negative voltage on the output terminal serves to close the circuit for a predetermined interval in a manner to be explained. When a control voltage which is positive with respect to ground appears on the output terminal of flip-flop 15, diodes 16 and 22 are biased in the forward direction and they conduct. Similarly diode 17 is biased in the forward direction and it also conducts. In consequence, the base is made more positive with respect to the collector by way of the capacitor and resistor 18 so that the transistor is reverse biased. This turns off the transistor or in other words makes the impedance between terminals 21 and 21' very high, approaching an open circuit condition. Also because of the low impedance path afforded by diode 17, capacitor 14 becomes charged to a value approaching that of the positive control voltage, the difference being due to the finite forward resistances which the didoes 16, 17 and 22 exhibit.

When the control signal to flip-flop 15 causes it to change state so that its output terminal becomes negative with respect to ground, diode 16 is then biased in the reverse direction. Diode 22 may still be forward biased, depending on the polarity of the input signal. However, even when the junction of resistor 13 and the collector of transistor 12 is positive with respect to ground very little current flows through this diode since the impedance of the diode is large in comparison with the impedance of the series-connected switch and load resistance. Most of the voltage drop in the input circuit appears across resistance 13 which is large (e.g. 100K) in comparison with the impedance of the series connected switch and load. This ensures that the junction of resistor 13 and the collector of transistor 12 will be at a low voltage with respect to the common reference potential, thus allowing diode 22 to operate in the high resistance region of its forward current-voltage characteristic curve. The capacitor, until it discharges, causes current to flow from the collector to the base of the transistor thereby biasing it in the forward direction. This turns the transistor "on," or, in other words, makes the impedance between the input and output terminals very low approaching a closed circuit condition. Resistor 13 determines the signal current flowing under this condition. After the charge on the capacitor is dissipated, however, the interval during which the switch is held on will terminate, so that, preferably, before this happens, the control signal applied to flip-flop 15 will again cause it to change state, thus opening the switch. The size of the capacitor, the impedances of the discharge paths, and the magnitude of the voltage which charges the capacitor during the period when the switch is "open" determines the maximum length of time during which the transistor can be held on. Preferably the positive voltage from flip-flop 15 is applied for a time sufficient to fully charge the capacitor. The input signal, whether posititve or negative, will have very little effect on the bias of the transistor and so also the impedance of the collector emitter circuit when a negative voltage is applied from flip-flop 15. The high impedance of the diode, especially diode 16 which is then reverse-biased effectively isolates the base of the transistor from the external circuits.

The following is a tabular listing of values for the components that have been found to work well in practice:

| | | |
|---|---|---|
| Resistor **13** | ohms | 100,000 |
| Resistor **18** | do | 22,000 |
| Resistor **19** | do | 4,700 |
| Capacitor **14** | microfarads | 10 |
| Diodes **16**, **17**, **22** | | 1N252 |
| Transistor **12** | | Philco T1452 |

The magnitude of the voltage provided by the flip-flop when the components listed above were used was +7.0 volts and the negative voltage was −2.5 volts. As is apparent from the foregoing description, the negative voltage need only be large enough to reverse bias the diode 16.

Figure 2:
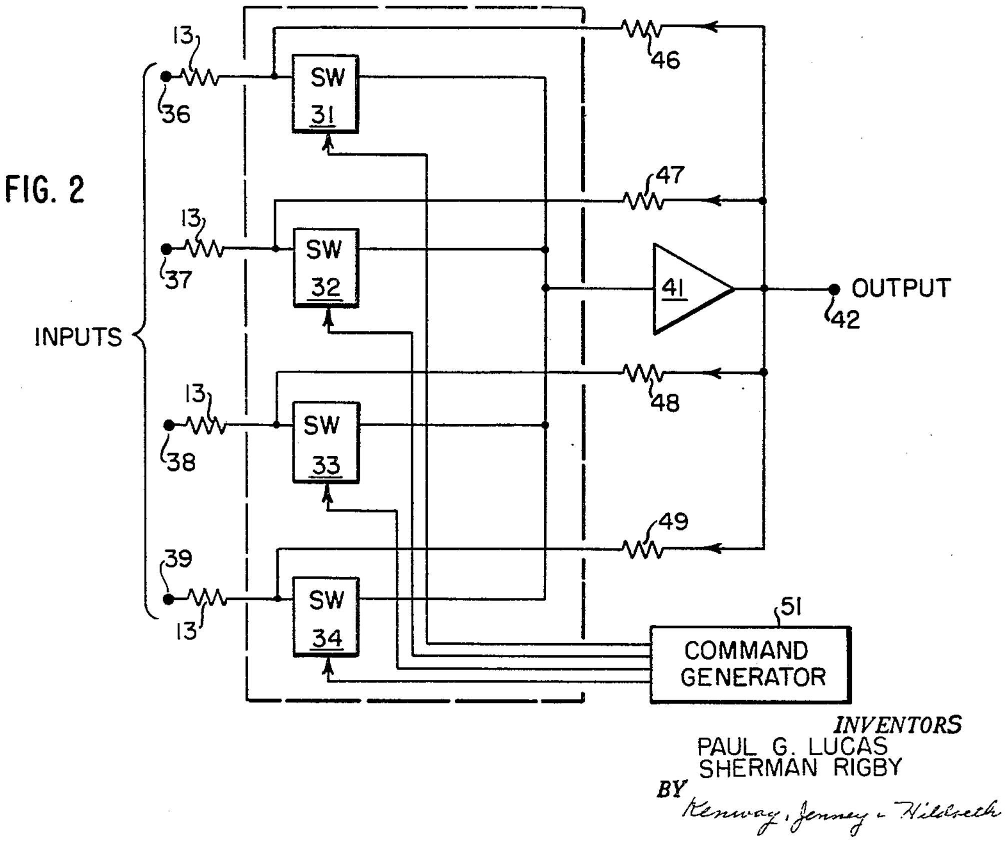
FIG. 2 is a block and line diagram illustrating an application of the circuit of FIG. 1.

In FIG. 2, four switching circuits made according to our invention are shown in a system environment for which they are particularly well suited, namely a multiplexing system for sequentially transferring signals from a plurality of input circuits to a common output. As shown, the switching circuits themselves, which have been designated 31–34, are connected between input terminals 36–39, respectively, and an amplifier 41. The output of the amplifier, in turn, is connected to the output terminal 42 for the system and also to negative feedback circuits, including resistors 46–49, around both the amplifier and the respective switches. The resistor 13 associated with each of the switches in conjunction with resistors 46–49 determines the gain between the input terminals 36–39 and the output terminal 42 when, as is usual, amplifier 41 has a very high open loop gain. To control the operation of the switches, a command generator 51 is illustrated. The latter may take any conventional form known to the art, its function being to provide, on the control lines leading to the switches, signals which are appropriately phased with respect to one another so that only one of the switches is effectively closed at a time. The purpose of the negative feedback is to stabilize the operation of the switches as well as that of the amplifier so that the relation of the signals at the output to those at the input will be relatively independent of random variations in the characteristics of both the switching circuit and the amplifier.

As mentioned above, the circuit of FIG. 1, provides effective isolation of the input terminal 11 from the control signal at the output terminal of flip-flop 15 only when the transistor switch is "on." When the switch is "off," a small voltage resulting from the finite forward resistance of diode 22 appears at the collector of transistor 12. In certain applications, this control signal during the "off" period may be undesirable. In FIG. 3 we have illustrated a circuit similar to that of FIG. 1, which provides complete isolation of the input and output leads from the control signal.

As shown in FIG. 3, a transistor 12 is connected between input terminals 11—11' and output terminals 21—21' in the same manner as in FIG. 1. A resistor 60 is connected between collector and base of transistor 12 for reasons to be explained below.

The switch control circuit includes a flip-flop 62, having output terminals **62*a* and 62*b*. Control signals are applied to flip-flop 62 via terminals 64 and 66. A pair of diodes 68 and 70 are connected to the output terminals of the flip-flop 62 as shown, diode 68 having one polarity and diode 70 the other. The flip-flop is so designed that one output terminal e.g. terminal 62*a*, is positive with respect to ground and the other terminal e.g. terminal 62*b***, is negative with respect to ground when the flip-flop is in a first state. When the state is reversed by the application of a control signal to the flip-flop, the terminals reverse polarity.

The buffer diodes 68 and 70 are each connected to the capacitor 72, diode 68 by diode 74 and resistor 76 from junction 77 and the buffer diode 70 by diode 78 and resistor 80 extending from junction 81. As shown the diodes 74 and 78 an resistors 76 an 80 form a bridge circuit, the capacitor 72 being connected between the junction points 82 and 84 of the bridge. The buffer diodes 86 and 88 connect the junction points 77 and 81 to the collector and base respectively of transistor 12.

To explain the operation of the circuit of FIG. 3 it will first be assumed that the flip-flop is in a state such that terminal 62*b* is positive and terminal 62*a* is negative with respect to ground. Under these conditions diodes 70 and 68 will be forward biased. Current can flow between terminals 81 and 77 via two paths, one including resistor 80 and diode 74 and the other including diode 78 and resistor 76. It will be observed that current flow is in the forward direction throdgh both diodes 74 and 78 so that the impedance of these diodes, as well as the buffer diodes 68 and 70 will be quite small. Hence substantially the entire voltage difference between terminals 62*a* and 62*b* will appear across the capacitor 72, the capacitor being charged with its lower plate positive with respect to the upper plate as seen in FIG. 3. While the capacitor is being charged, the diodes 86 and 88 are reverse biased and therefore they effectively disconnect the transistor 12 from the control circuit. The capacitor 72 charges until it is substantially at the potential difference of terminals 62*a* and 62*b*.

When the state of flip-flop 62 is reversed by reason of a pulse or other control signal applied across terminals 64 and 66, the diodes 68, 70, 74 and 78 are reverse biased; diodes 68 and 70 then effectively disconnect the flip-flop from the control circuit. The capacitor 72 now discharges through resistor 76, diode 86, the collector-base diode of transistor 12, diode 88 and resistor 80. The discharge current of capacitor 72, flowing through the collector-base diode of the transistor turns the transistor "on" and connects terminals 11 and 21 via a low impedance path. This condition remains until flip-flop 62 is returned to its original state, at which time the transistor switch opens and capacitor 72 recharges for the next operation of the switch. The resistor 60 provides a path for current flow when the transistor 12 is shut off. Its presence assures rapid opening of the switch when the flip-flop state is reversed.

Figure 4:
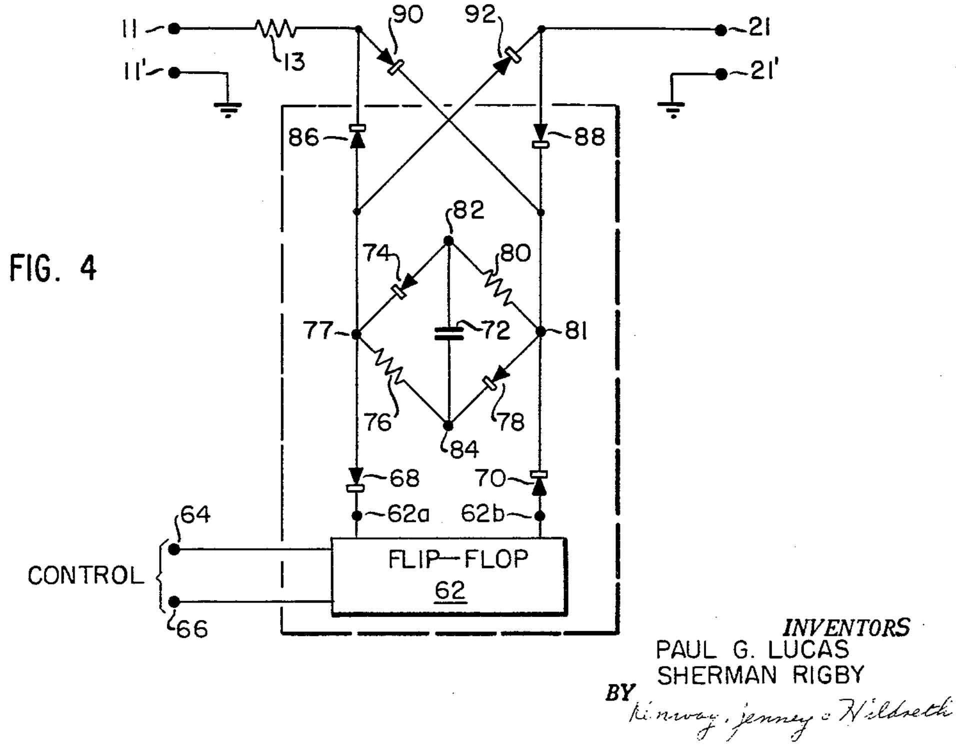
FIG. 4 is a schematic diagram of the control circuit of our invention used with a diode switch.

As so far described, the control circuits of our invention have been employed with transistor switches as illustrated in FIGS. 1 and 3. In FIG. 4 we have illustrated how the switch control circuit of FIG. 3 may be utilized with a diode switch. As shown therein, the control circuit is identical to that of FIG. 3. However, the transistor 12 and resistor 60 of FIG. 3 are replaced by the diodes 90 and 92 respectively, the cathode of diode 90 being connected via resistor 13 to the input terminal and the anode of diode 92 being connected to output terminal 21. The diodes 86, 88, 90 and 92 form a diode bridge, the input terminal 11 and output terminal 21 being connected to one pair of opposite terminals of the bridge and the junction points 77 and 81 to the other opposite pair of bridge terminals. During the time that capacitor 72 is charging, the positive voltage on terminal 62*b* and the negative voltage on terminal 62*a* reverse biases all the diodes in said bridge, thus effectively open circuiting the switch. When the state of flip-flop 62 is such that the condenser is discharging, the four diodes forming the bridge are all forward biased and the input terminal is connected to the output terminal via a low impedance path. Further, diodes 68 and 70 will be reverse biased and the flip-flop will effectively be disconnected from the switch.

It will thus be seen that we have provided improved circuits for the control of series electronic switches, these switches having the property that their control terminals may be completely isolated from their driving terminals. In contrast to prior control circuits, our circuits eliminate the need for transformers, with their attendant disadvantages. Instead, we provide a storage element i.e. a capacitor which is charged during the "off" period of the switch by the voltage which biases the switch "off." When the bias voltage is removed the discharge current from the storage element drives the control circuit of the switch, causing it to turn "on." It will be noted that the diodes, resistors and condensers which are the components of our switch control circuit are all realitively inexpensive as compared to the transformers previously used. Thus our switch control circuit is relatively inexpensive in construction.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. A circuit for controlling an electronic switch, said switch being connected in series between an input and an output terminal and having control terminals, said switch being closed when current is supplied to said control terminals in a given direction, said control circuit including a voltage source having a pair of terminals for supplying a voltage of a first polarity across said terminals during periods when said switch is to be open, and a voltage of opposite polarity when said switch is to be closed, a capacitor, a diode connecting a first terminal of said voltage source to one electrode of said capacitor, said diode being poled to charge said capacitor in a first direction when said volotage source is supplying a voltage of said first polarity, and to disconnect said voltage source from said capacitor when said source is supplying an opposite polarity voltage, a first resistor connected in parallel with said capacitor, a second diode connected to the other electrode of said capacitor, a second resistor in series with said second diode, means connecting the series combination of said second diode and said second resistor in parallel with said capacitor, means connecting one control terminal of said switch to one end of said second diode, and means connecting the other control terminal to the opposite end of said second diode, a third diode connecting the junction point of said second diode and said second resistor to a second terminal of said voltage source, said second and third diodes being conductive during periods when said voltage has said first polarity and substantially non-conductive during periods when said voltage has said opposite polarity, the discharge path of said capacitor during said periods of opposite polarity voltage being through said switch control terminals whereby the discharge of said capacitor maintains said switch in a closed condition.

2. An electronic switch, comprising, in combination, a transistor, having a base terminal, an emitter terminal and a collector terminal, a first terminal of said switch being said emitter and a second terminal of said switch being said collector terminal, and a control circuit for said transistor including a voltage source having a pair of terminals for supplying a voltage of a first polarity across said terminals during periods when said switch is to be open, and a voltage of opposite polarity across said terminals when said switch is to be closed, a capacitor, means including a diode interconnecting said capacitor and a first terminal of said voltage source, said diode being poled to charge said capacitor in a first direction when said voltage source is supplying a voltage of said first polarity, and to disconnect said voltage source from said capacitor when said source is supplying a voltage of opposite polarity, a second diode, first means connecting said second diode in parallel with said capacitor, a first terminal of said second diode being connected to said capacitor, said second diode being conductive during periods when said voltage has said first polarity, and substantially non-conductive during periods when said voltage has said opposite polarity, means connecting the second terminal of said second diode to a second terminal of said voltage source and second means including said first means connecting said capacitor across said base terminal and one other terminal of said transistor, the discharge path of said capacitor during said periods of opposite polarity voltage being through said transistor whereby the discharge of said capacitor maintains said switch in a closed condition.

3. The combination defined in claim 2 wherein said first means includes a resistor.

4. A circuit for controlling an electronic switch, said switch being connected in series between an input and an output terminal and having a plurality of control terminals, said switch being closed when current is supplied to said control terminals in a given direction, said control circuit including a voltage source having a pair of terminals for supplying a voltage of a first polarity across said terminals during periods when said switch is to be open, and a voltage of opposite polarity across said terminals when said switch is to be closed, an electrical energy storage element, means including a first diode interconnecting a first terminal of said voltage source and a first electrode of said storage element, said first diode being poled to charge said storage element in a first direction when said voltage source is supplying a voltage of said first polarity, a second diode, means interconnecting a first terminal of said second diode and a second electrode of said energy storage element, means interconnecting a second terminal of said second diode and a second terminal of said voltage source, said second diode being conductive when said voltage source has said first polarity and substantially non-conductive when said voltage source has said opposite polarity, means connecting the first electrode of said energy storage element to said second terminal of said second diode, means connecting the second electrode of said energy storage element to a first control terminal of said switch, and means connecting the second terminal of said second diode to a second control terminal of said switch, the discharge path of said energy storage element during said period of opposite polarity being through said switch, whereby the discharge of said storage element maintains said switch in a closed condition.

5. The combination defined in claim 4 wherein the means connecting the first electrode of said energy storage element to said second terminal of said second diode includes a resistor.

6. The combination defined in claim 4 wherein the means interconnecting said second terminal of said second diode and said second terminal of said voltage source includes a diode, said diode being conductive when said voltage source has said first polarity and substantially non-conductive when said voltage source has said opposite polarity.

7. The combination defined in claim 2 wherein the means connecting the second terminal of said second diode to a second terminal of said voltage source includes a diode, said diode being conductive during periods when said voltage has said first polarity, and substantially nonconductive when said voltage has said opposite polarity.

8. The combination defined in claim 4 in which the said means connecting the second electrode of said energy storage element to a first control terminal of said switch includes a resistor having a first terminal connected to the second electrode of said storage element, and in which the means including a first diode interconnecting a first terminal of said voltage source and a first electrode of said storage element consists of a third diode having a first terminal connected to said first electrode of said voltage source and a second terminal connected to a second terminal of said resistor, said third diode being poled to charge said storage element in a first direction when said voltage source is supplying a voltage of said first polarity and to disconect said voltage source from said storage element when said source is supplying an opposite polarity voltage.

9. The combination defined in claim 8 in which the means connecting the first electrode of the energy storage element to the second terminal of the second diode includes a resistor, said resistor being connected in series with the first and second diodes and forming a bridge network with said diodes.

10. The combination defined in claim 4 in which the means connecting the second electrode of the energy storage element to a first control terminal of the switch and the means connecting the second terminal of the second diode to a second control terminal of the switch include diodes, said diodes being poled to be conductive when said voltage source is supplying a voltage of said opposite polarity and substantially nonconductive when said voltage source is supplying a voltage of said first polarity.

11. A circuit for controlling an electronic switch, said switch being connected in series between an input and an output terminal and having a plurality of control terminals, said switch being closed when current is supplied to said control terminals in a given direction, said control circuit including a voltage source having a pair of terminals for supplying a voltage of a first polarity across said terminals during periods when said switch is to be open, and a voltage of opposite polarity across said terminals when said switch is to be closed, an electrical energy storage element, first and second diodes interconnecting a first terminal of said voltage source and a first electrode of said storage element, said first and second diodes being poled to charge said storage element in a first direction when said voltage source is supplying a voltage of said first polarity, and to disconnect said voltage source from said storage element when said source is supplying an opposite polarity voltage, a third diode, means interconnecting a first terminal of said third diode and a second electrode of said energy storage element, a fourth diode interconnecting a second terminal of said third diode and a second terminal of said voltage source, said third and fourth diodes being conductive when said voltage source has said first polarity and substantially nonconductive when said voltage source has said opposite polarity, a first resistor connecting the first electrode of said energy storage element to said second terminal of said third diode, a second resistor connecting the second electrode of said energy storage element to the junction point of said first and second diodes, means connecting said junction point to a first control terminal of the switch, means connecting said second terminal of said third diode to a second control terminal of said switch, the discharge path of said energy storage element during said period of opposite polarity being through said switch, whereby the discharge of said storage element maintains said switch in a closed condition.

References Cited in the file of this patent

UNITED STATES PATENTS

| | | |
|---|---|---|
| 2,961,553 | Giger | Nov. 22, 1960 |
| 3,011,129 | Magleby et al. | Nov. 28, 1961 |